(12) United States Patent
Sanemasa et al.

(10) Patent No.: US 8,038,136 B2
(45) Date of Patent: Oct. 18, 2011

(54) HAND HAVING ROCKING MECHANISM AND SUBSTRATE DELIVERING DEVICE HAVING THE SAME

(75) Inventors: Hiroki Sanemasa, Kitakyushu (JP); Hideo Yamamoto, Kitakyushu (JP); Naoomi Torii, Tokyo (JP); Takahiro Ogawa, Tokyo (JP); Seiji Katsuoka, Tokyo (JP); Hidetaka Nakao, Tokyo (JP); Natsuki Makino, Utsunomiya (JP)

(73) Assignees: Kabushiki Kaisha Yaskawa Denki, Kitakyushu-shi (JP); Ebara Corporation, Tokyo (JP)

(*) Notice: Subject to any disclaimer, the term of this patent is extended or adjusted under 35 U.S.C. 154(b) by 356 days.

(21) Appl. No.: 12/407,826

(22) Filed: Mar. 20, 2009

(65) Prior Publication Data
US 2009/0236786 A1   Sep. 24, 2009

(30) Foreign Application Priority Data

Mar. 24, 2008   (JP) ................. P.2008-075745

(51) Int. Cl.
*H01L 21/683* (2006.01)
*B65G 49/07* (2006.01)
*B23Q 3/18* (2006.01)

(52) U.S. Cl. .............. 269/58; 414/941; 294/103.1

(58) Field of Classification Search ............ 269/58, 269/80; 294/1.1, 103.1, 104, 902; 414/225.01, 414/744.1, 780, 936, 941
See application file for complete search history.

(56) References Cited

U.S. PATENT DOCUMENTS

| | | | |
|---|---|---|---|
| 6,250,870 B1 * | 6/2001 | Anderson et al. | 414/222.01 |
| 6,462,411 B1 * | 10/2002 | Watanabe et al. | 257/723 |
| 6,669,434 B2 * | 12/2003 | Namba et al. | 414/744.5 |
| 7,290,813 B2 * | 11/2007 | Bonora et al. | 294/1.1 |
| 7,334,826 B2 * | 2/2008 | Woodruff et al. | 294/103.1 |
| 7,374,391 B2 * | 5/2008 | Rice et al. | 414/744.8 |
| 7,547,053 B2 * | 6/2009 | Yoshida et al. | 294/103.1 |
| 7,644,968 B2 * | 1/2010 | Hirooka et al. | 294/103.1 |
| 7,712,806 B2 * | 5/2010 | Adachi | 294/64.1 |
| 2004/0037682 A1 * | 2/2004 | Yoshioka et al. | 414/458 |
| 2005/0210669 A1 * | 9/2005 | Yoshida et al. | 29/750 |
| 2008/0156357 A1 * | 7/2008 | Mitsuyoshi | 134/133 |
| 2008/0237172 A1 * | 10/2008 | Uratani et al. | 212/299 |
| 2009/0092469 A1 * | 4/2009 | Sekimoto et al. | 414/225.01 |

* cited by examiner

*Primary Examiner* — David B Thomas
(74) *Attorney, Agent, or Firm* — Sughrue Mion, PLLC

(57) ABSTRACT

A hand 1 is constituted by a hand base 4 serving as a base portion, a rocking hand 3 disposed to be superposed on the hand base 4 and serving to support a substrate 2, and a rocking mechanism 5 provided between the hand base 4 and the rocking hand 3 and serving to support the rocking hand 3 to be tiltable and movable in parallel with respect to the hand base 4.

7 Claims, 4 Drawing Sheets

HAND HAVING ROCKING MECHANISM AND SUBSTRATE DELIVERING DEVICE HAVING THE SAME

BACKGROUND OF THE INVENTION

The present invention relates to a substrate delivering device for delivering a substrate such as a wafer or a liquid crystal in a semiconductor manufacturing apparatus, and more particularly to a hand for directly transmitting/receiving the substrate to/from other apparatuses.

A semiconductor manufacturing apparatus includes a substrate delivering device for delivering a substrate to a desirable position in the apparatus. The substrate delivering device includes a hand for properly holding the substrate. In a large number of semiconductor manufacturing apparatuses, the substrate is horizontally held and delivered in the apparatus by means of the hand in order to carry out a predetermined treatment over a surface or a back face which is a plane of the substrate. In the semiconductor manufacturing apparatus, the substrate mounted on the hand is further held by another substrate holding mechanism in the apparatus and is transmitted/received in a baton passing way. In other words, a separate substrate holding mechanism from the hand in the apparatus approaches the substrate held by the hand in a horizontal condition from above and transmits/receives the substrate in a normal direction of the plane of the substrate. However, the substrate holding mechanism and the hand of the substrate delivering device have horizontal levels which are not adapted to each other or have planar positions shifted from each other in some cases. Therefore, it is hard to directly transmit/receive the substrate between them.

For this reason, a station for temporarily mounting the substrate thereon is provided between the substrate delivering device and the substrate holding mechanism in some cases. A mounting surface of the station is provided with a guide groove for carrying out an adjustment to adapt the level of the station to that of the substrate holding mechanism and correcting the planar position of the substrate when the substrate delivering device mounts the substrate on the station. Consequently, a substrate processing device mounts the substrate on the station and the substrate holding mechanism approaches the substrate mounted on the station which is to be taken so that the substrate is properly delivered from the substrate delivering device to the substrate holding mechanism.

In this case, the station only has a mounting portion for mounting the substrate thereon and does not have a mechanism for positively holding the substrate held on the hand of the substrate delivering device. In other words, the hand of the substrate delivering device only mounts the substrate on the mounting portion at a substrate receiving side. Even if the horizontal levels of the hand and the station are not adapted to each other or the planar positions are slightly shifted from each other, accordingly, the hand can mount the substrate on the mounting portion of the station without trouble.

However, a reduction in a size of a footprint is required in the semiconductor manufacturing apparatus. When the station is provided, the size of the apparatus is increased correspondingly.

If the station is not provided, however, it is hard to properly transmit/receive the substrate directly in the normal direction of the plane of the substrate between the hand and the substrate holding mechanism.

In consideration of the problems, it is an object of the invention to provide a hand for a substrate delivering device which can directly transmit/receive a substrate held on the hand to/from a substrate holding mechanism on a partner side in a normal direction of a plane of the substrate.

In order to solve the problem, the invention has the following structure.

According to a first aspect of the invention, there is provided a hand for holding a substrate in a horizontal plane, including:

a hand base serving as a base portion, a rocking hand disposed to be superposed on the hand base and serving to support the substrate, and a rocking mechanism provided between the hand base and the rocking hand and serving to support the rocking hand to be tiltable and movable in parallel with respect to the hand base.

According to a second aspect of the invention, there is provided the hand according to the first aspect, wherein the rocking mechanism supports the rocking hand by means of a compression spring.

According to a third aspect of the invention, there is provided the hand according to the first aspect, wherein the rocking hand includes a guide pin for correcting a position in a horizontal direction in abutment on a periphery of the substrate, and the guide pin is pressed down from a surface of the rocking hand.

According to a fourth aspect of the invention, there is provided the hand according to the third aspect, wherein the rocking hand includes a pad on which the substrate guided by the guide pin is mounted and a gripping click for gripping the periphery of the substrate mounted on the pad.

According to a fifth aspect of the invention, there is provided the hand according to the fourth aspect, further including:

an external wall for surrounding the rocking mechanism and a gripping click driving mechanism for driving the gripping click is provided on the hand base.

According to a sixth aspect of the invention, there is provided a substrate delivering device including:

the hand according to the first aspect.

According to a seventh aspect of the invention, there is provided a semiconductor manufacturing apparatus including:

the substrate delivering device according to the sixth aspect, and a holding mechanism for directly transmitting/receiving the substrate to/from the hand.

According to the invention, even if the horizontal level or planar position of the holding mechanism on the partner side for directly transmitting/receiving the substrate to/from the hand in the planar direction of the substrate is not adapted to that of the hand, the rocking hand portion of the hand is rocked in conformity with the holding mechanism on the partner side. Therefore, it is possible to reliably transmit/receive the substrate between the hand and the holding mechanism on the partner side.

DETAILED DESCRIPTION OF THE PREFERRED EMBODIMENTS

A specific embodiment of a method according to the invention will be described below with reference to the drawings.

Embodiment 1

Figure 1:
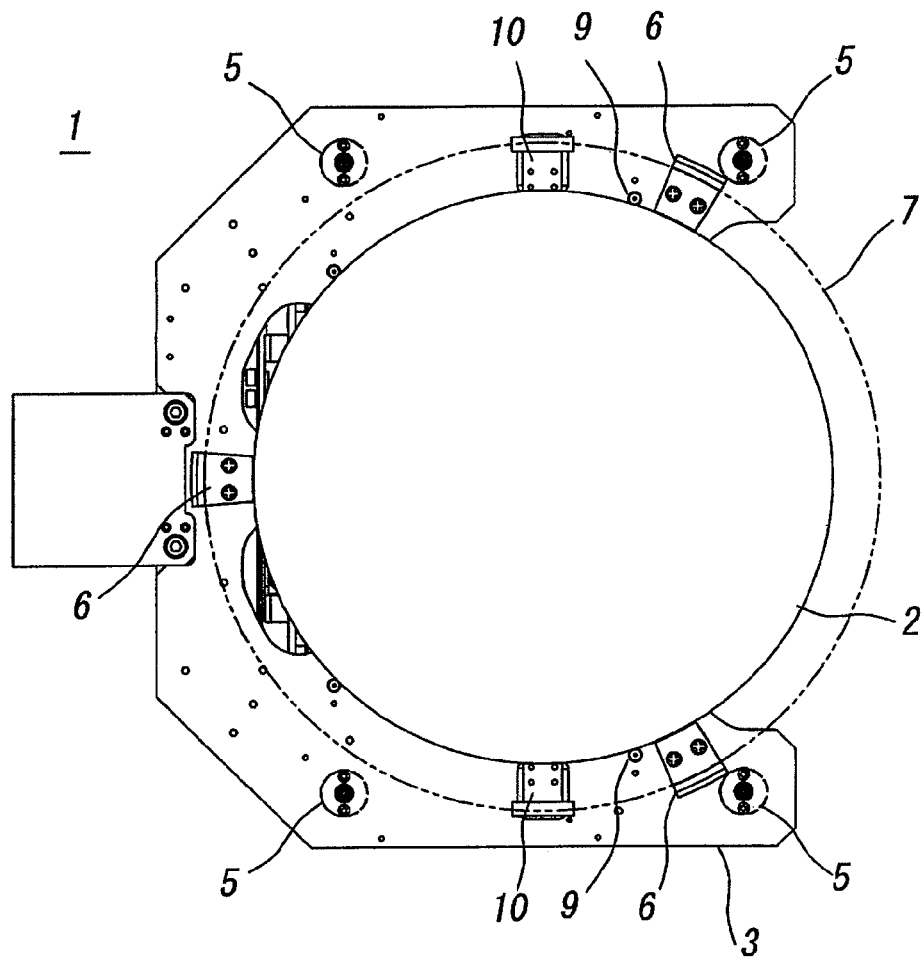
FIG. 1 is a top view (a plan view) showing a state in which a hand according to the invention mounts a substrate thereon.
Figure 2:
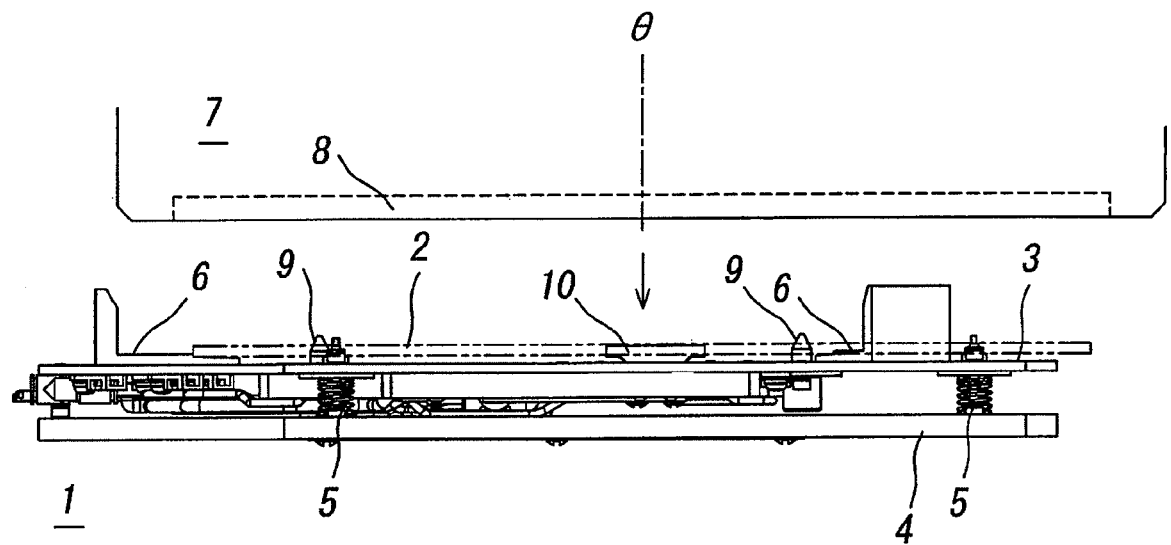
FIG. 2 is a side view showing the hand according to the invention.

FIG. 1 is a plan view showing a hand 1 according to the invention. A substrate 2 is mounted on the hand 1. The hand 1 serves to mount the substrate 2 thereon in such a manner that a plane of the substrate 2 is horizontal. A holding mechanism 7 for directly transmitting/receiving the substrate 2 to/from the hand 1 in a normal direction of the plane of the substrate 2 is drawn in a two-dotted chain line above the hand 1. FIG. 2 is a side view of FIG. 1, illustrating a part of the holding mechanism 7.

As shown in FIGS. 1 and 2, the hand 1 is constituted by a rocking hand 3 and a hand base 4 which have the same shapes as seen on a plane, and the hand base 4 is disposed to be superposed on the rocking hand 3. A rocking mechanism 5 which will be described below is provided between the rocking hand 3 and the hand base 4. The rocking hand 3 is supported to be tiltable or movable in parallel with respect to a surface of the hand base 4. The holding mechanism 7 serves to adsorb and hold a surface (an upper surface) of the substrate 2 through an adsorbing surface 8 and to then rotate the substrate 2 about a θ axis in the drawing.

As shown in FIGS. 1 and 2, three pads 6 are fixed to an upper surface of the rocking hand 3. In the embodiment, the three pads 6 take an L shape respectively and have vertical surfaces and almost planes. The vertical surfaces take arcuate shapes to draw a part of a circle as shown in FIG. 1. As shown in FIG. 2, inclined surfaces are formed on respective upper ends of the vertical surfaces. Moreover, the substrate 2 is mounted on the almost plane portion. The vertical surfaces of the pads 6 are formed to conform to outer peripheral shapes of the hand 1 according to the invention and the holding mechanism 7 for directly transmitting/receiving the substrate 2 as shown in FIG. 1. In the embodiment, the holding mechanism 7 takes the outer peripheral shape of a cylinder. Therefore, the configuration is obtained.

Figure 6:
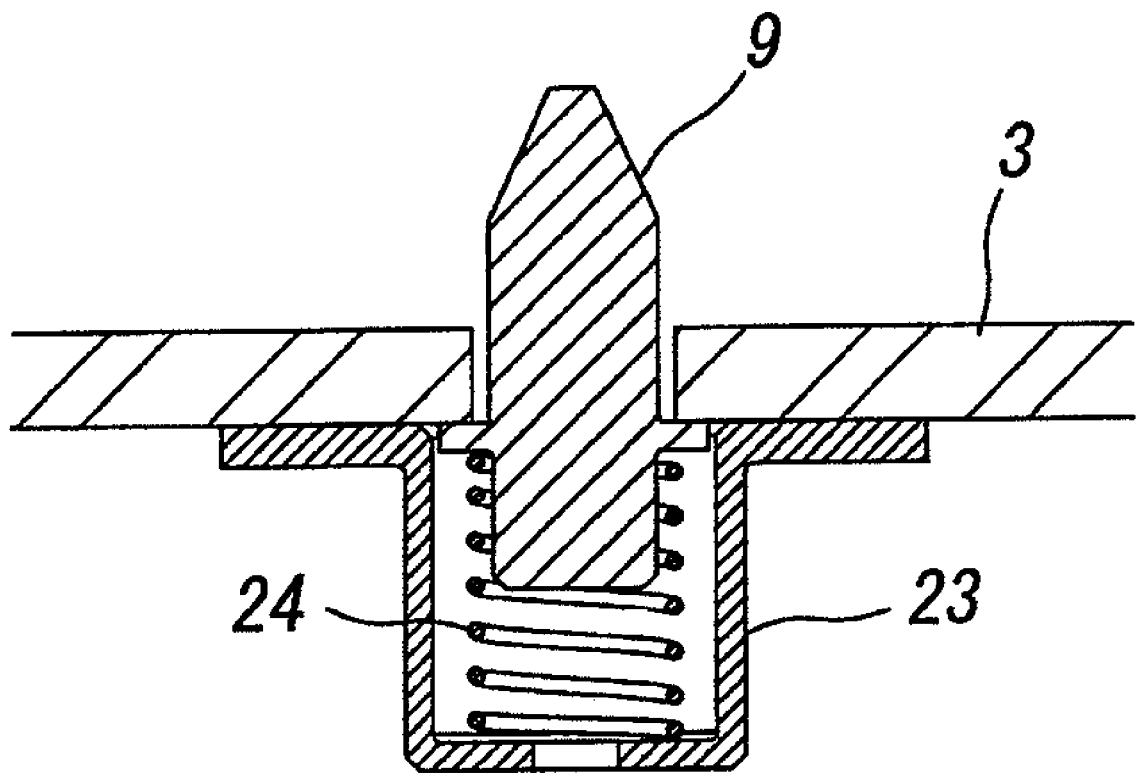
FIG. 6 is a sectional side view showing a structure of a guide pin according to the invention.

Furthermore, four guide pins 9 are fixed to the upper surface of the rocking hand 3 as shown in FIG. 1. The guide pins 9 have inclined surfaces formed on upper ends thereof respectively, and serve to guide the substrate 2 to an accurate position in a planar position in contact with an outer periphery of the substrate 2 and to precisely mount the substrate 2 on the almost planes of the pads 6 when the hand 1 is to mount the substrate 2 thereon. FIG. 6 shows a more detailed structure of the guide pin 9. FIG. 6 is a sectional view showing the structure of the guide pin 9. As shown in FIG. 6, the guide pin 9 is supported by a holder 23 and a coil spring 24. The holder 23 envelops the coil spring 24 and is fixed to a back face of the rocking hand 3. A base end side of the guide pin 9 is inserted into a tip of the coil spring 24 and the guide pin 9 is inserted into a through hole provided on the rocking hand 3 and has a tip constituted to be protruded from the surface of the rocking hand 3. When the guide pin 9 is pressed down from the tip side so that the holding mechanism 7 and the hand 1 are close to each other as will be described below, accordingly, the guide pin 9 can be pressed down to a bottom by means of the holding mechanism 7 so as not to disturb the transmission/receipt of the substrate 2 through at least the holding mechanism 7 and the hand 1.

As shown in FIG. 1, furthermore, two gripping clicks 10 are disposed on the upper surface of the rocking hand 3. The gripping click 10 can grip the outer periphery of the substrate 2 mounted on the pad 6 by means of the two gripping clicks 10. When the hand 1 is to be moved through a driving portion of the substrate delivering device which is not shown, the gripping click 10 can prevent the substrate 2 from being separated from the pad 6. The gripping click 10 is driven by a gripping click driving mechanism 11 provided between the rocking hand 3 and the hand base 4.

Figure 3:
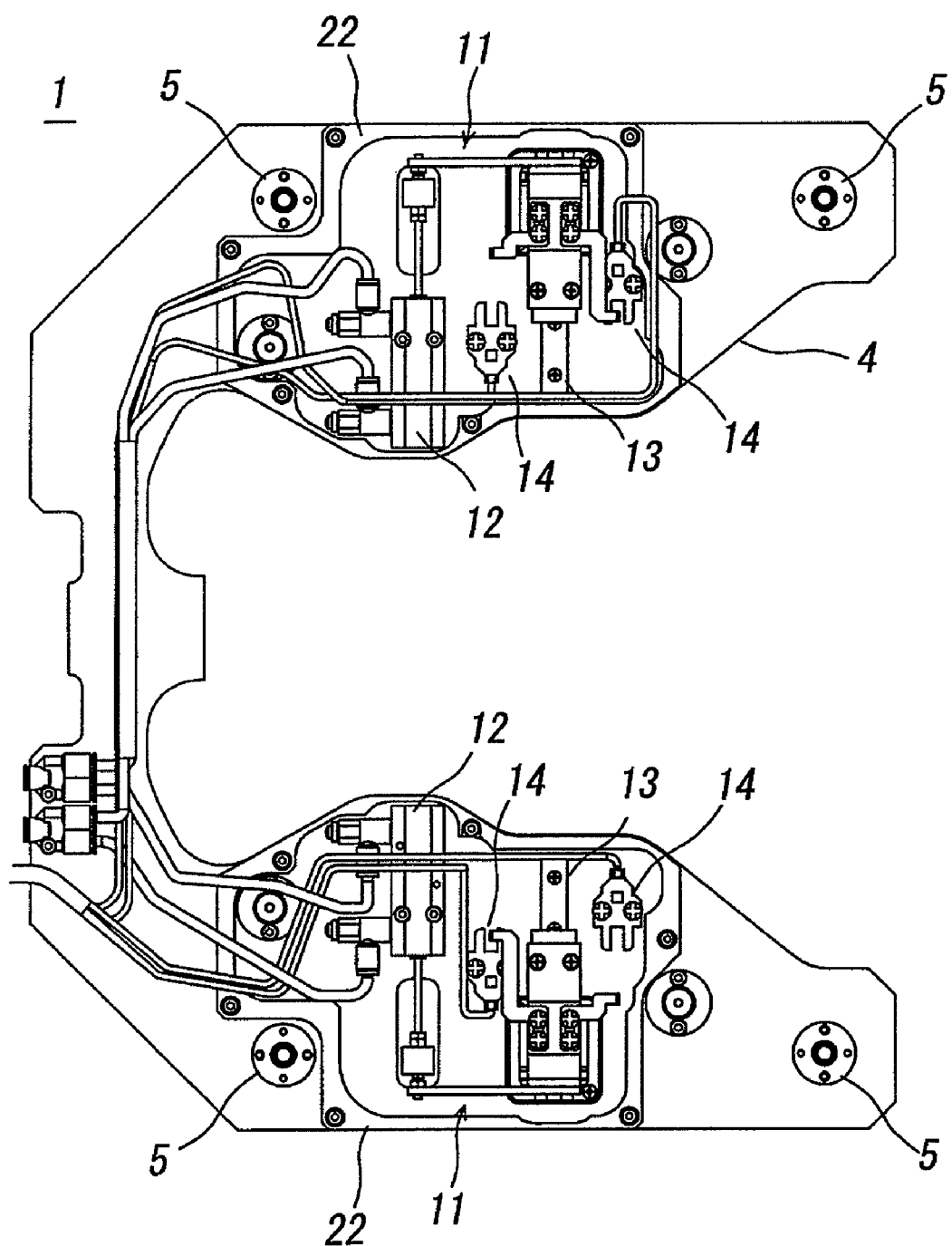
FIG. 3 is a top view showing a hand base according to the invention.

FIG. 3 is a perspective view showing the rocking hand 3 in the same plan view illustrating the hand 1 according to the invention as FIG. 1. As shown in FIG. 3, each of the gripping click driving mechanisms 11 for driving the gripping click 10 is constituted by an air cylinder 12, a sensor 14 and a linear guide 13. The air cylinder 12 can be moved by a proper supply of compressed air through a solenoid valve which is not shown. The gripping click 10 is connected to an output shaft of the air cylinder 12 and is operated by means of the air cylinder 12. The gripping click 10 is also connected to the linear guide 13 and can be thus operated with fine guiding in a desirable direction. Moreover, a part of the gripping click 10 is formed to enable light shielding for an optical axis of the sensor 14 and a signal of the sensor 14 is switched depending on an operating position of the gripping click 10. The signal of the sensor 14 is transmitted to a controller of the substrate delivering device which is not shown and detects a state in which the hand 1 accurately grips the substrate 2 or not.

Figure 4:
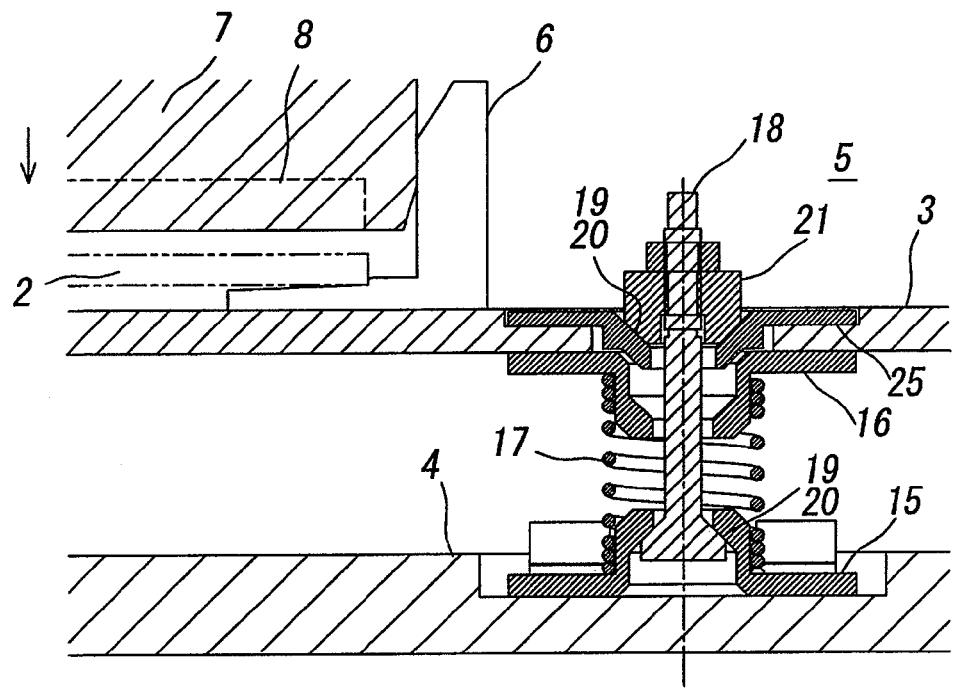
FIG. 4 is a side view showing a rocking mechanism of the hand according to the invention.

As shown in FIG. 3, the rocking mechanism 5 for rocking the rocking hand 3 is provided in four places of the hand base 4. It is sufficient that the rocking mechanism 5 is provided in at least three places. FIG. 4 is a side view showing a structure of the rocking mechanism 5 in detail. The rocking mechanism 5 is mainly constituted by a first spring receiver 15, a second spring receiver 16, a compression spring 17 and a shaft 18. A bottom face of the first spring receiver 15 is fixed to an upper surface of the hand base 4. A protrusion is formed on an upper surface of the first spring receiver 15. The protruded portion is inserted into a base end side of the compression spring 17. An upper surface of the second spring receiver 16 is fixed into a corresponding position to the first spring receiver 15 over the back face of the rocking hand 3. The same projection as that of the first spring receiver 15 is formed on a bottom face of the second spring receiver 16 and is inserted into an upper end side of the compression spring 17. Furthermore, a bowl hole 20 is formed on a center of the first spring receiver 15 from a bottom face. The bowl hole 20 penetrates the upper surface of the first spring receiver 15. The shaft 18 is inserted through the bowl hole 20. A taper portion 19 is formed on a base end side of the shaft 18 and the taper portion 19 and an inclined surface of the bowl hole 20 come in contact with each other. On the other hand, a through hole is vertically formed also on a center of the second spring receiver 16 and the shaft 18 penetrates therethrough. A tip side of the shaft 18 further penetrates the hand base 4. A nut seat 25 is fixed into corresponding positions to the first spring receiver 15 and the second spring receiver 16 over the upper surface of the rocking hand 3. The same hole as the bowl hole 20 formed on the first spring receiver 15 is provided in the vicinity of a center of the nut seat 25. A screw groove is formed in the vicinity of the tip of the shaft 18 and a nut 21 is engaged therewith. The same inclined surface as the taper portion 19 formed on the base end side of the shaft 18 is provided in the vicinity of a lower end of the nut 21, and the taper portion 19 and the inclined surface of the bowl hole 20 for the shaft 18 come in contact with each other. By adjusting the nut 21, it is possible to regulate a distance between the rocking hand 3 and the hand base 4. Since the bowl hole 20 abuts on the nut 21, the nut seat 25 is provided as a separate component from the rocking hand 3 and a material having a high hardness is used in the embodiment. However, it is also possible to directly form the bowl hole 20 on the rocking hand 3 without using the nut seat 25.

According to the rocking mechanism 5 having the structure described above, the rocking hand 3 fixed to be interposed between the nut 21 on the tip of the shaft 18 and the second spring receiver 16 is usually energized apart from the hand base 4 by a spring force of the compression spring 17. On the other hand, since the shaft 18 and the taper portion 19 of the nut 21 are provided in contact with the first spring receiver 15 and the bowl hole 20 of the nut seat 25, they are always stabilized in a guiding state in the normal direction of the rocking hand 3.

Figure 5:
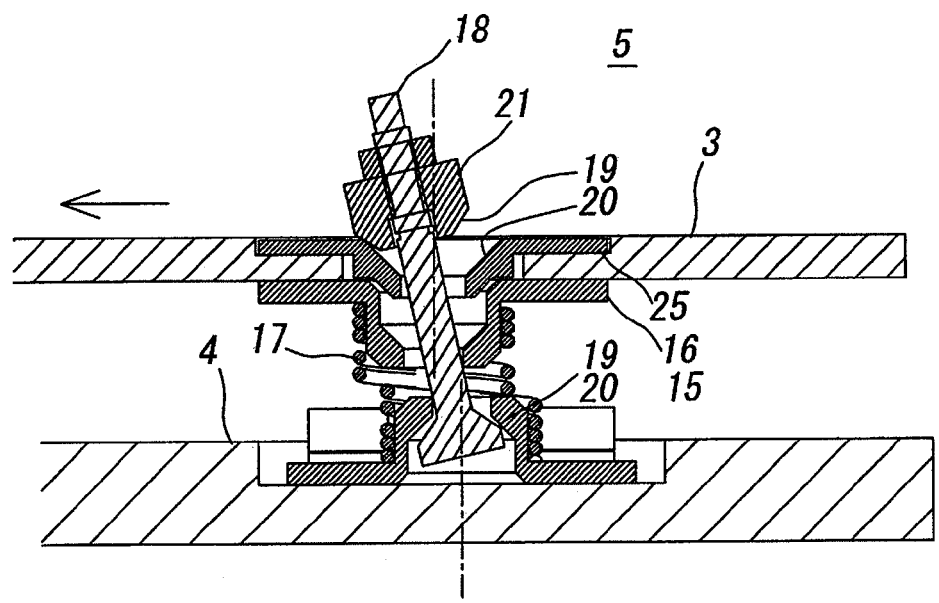
FIG. 5 is a side view showing an action of the rocking mechanism of the hand according to the invention.

When an external force is applied to the hand base 4, however, the base end side of the shaft 18 is slid in the bowl hole 20 and the taper portion 19 so that the tip side of the shaft 18 (the hand base 4 side) can carry out a precession. Therefore, the hand base 4 is slid in parallel with the rocking hand 3 or is inclined to the rocking hand 3 as shown in FIG. 5.

Referring to the hand 1 having the rocking mechanism 5, accordingly, when the holding mechanism 7 and the hand 1 approach each other in a vertical direction (the normal direction of the substrate 2) as shown in FIG. 4, the vertical surface of the pad 6 can first come in contact with the outer periphery of the holding mechanism 7 to move a planar position of the rocking hand 3 in a very small amount with respect to the hand base 4, thereby carrying out an adjustment even if positions in the planes are shifted from each other or the adsorbing surface 8 is inclined to the hand 1 and horizontal levels are not adapted to each other. When the adsorbing surface 8 abuts on the surface of the substrate 2, furthermore, the rocking hand 3 is inclined to conform to the horizontal level of the adsorbing surface 8. Therefore, the adsorbing surface 8 and the surface of the substrate 2 are set to be parallel with each other so that the adsorbing surface 8 can reliably adsorb the substrate 2. More specifically, when the holding mechanism 7 and the hand 1 are to directly transmit/receive the substrate 2, the direct transmission/receipt can be reliably executed by an action of the rocking mechanism 5.

Moreover, the guide pin 9 guiding the planar position of the substrate 2 in the mounting of the substrate 2 on the hand 1 can be pressed down to the bottom in the rocking hand 3 as shown in FIG. 6 in the embodiment. When the adsorbing surface 8 abuts on the surface of the substrate 2, therefore, the guide pin 9 is pressed down by the adsorbing surface 8. Therefore, the transmission/receipt of the substrate 2 through the adsorbing surface 8 and the hand 1 can be prevented from being disturbed.

In the embodiment, furthermore, an external wall 22 is formed on the hand base 4 to surround the rocking mechanism 5 and the gripping click driving mechanism 11 as shown in FIG. 3. The external wall 22 can prevent water or chemicals from entering the mechanisms from an outside. By forming the external wall 22, it is possible to use the hand according to the invention in the substrate delivering device of the semiconductor manufacturing apparatus which carries out polishing or washing over the substrate, for example.

What is claimed is:

1. A hand for holding a substrate in a horizontal plane, comprising:
   a hand base serving as a base portion,
   a rocking hand disposed to be superposed on the hand base and serving to support the substrate, and
   a rocking mechanism provided between the hand base and the rocking hand and serving to support the rocking hand to be tiltable and movable in parallel with respect to the hand base.
2. The hand according to claim 1, wherein
   the rocking mechanism supports the rocking hand by means of a compression spring.
3. The hand according to claim 1, wherein
   the rocking hand includes a guide pin for correcting a position in a horizontal direction in abutment on a periphery of the substrate, and
   the guide pin is pressed down from a surface of the rocking hand.
4. The hand according to claim 3, wherein
   the rocking hand includes a pad on which the substrate guided by the guide pin is mounted and a gripping click for gripping the periphery of the substrate mounted on the pad.
5. The hand according to claim 4, further comprising:
   an external wall for surrounding the rocking mechanism and a gripping click driving mechanism for driving the gripping click provided on the hand base.
6. A substrate delivering device comprising:
   the hand according to claim 1.
7. A semiconductor manufacturing apparatus comprising:
   the substrate delivering device according to claim 6, and
   a holding mechanism for directly transmitting receiving the substrate to from the hand.

* * * * *